United States Patent [19]

Phillips et al.

[11] 4,117,713

[45] Oct. 3, 1978

[54] PARTICULOGRAPHY AS AN ON-LINE TECHNIQUE FOR DETECTION AND LOCATION OF FAULTS WITHIN A GAS-COOLED DYNAMOELECTRIC MACHINE CAUSED BY OVERHEATING

[75] Inventors: David C. Phillips, Penn Hills; William M. Hickam, Churchill Borough; Gerald L. Carlson, Mt. Lebanon, all of Pa.

[73] Assignee: Westinghouse Electric Corp., Pittsburgh, Pa.

[21] Appl. No.: 763,482

[22] Filed: Jan. 28, 1977

[51] Int. Cl.² ............................................. G01N 25/02
[52] U.S. Cl. ....................................... 73/17 R; 73/28; 73/339 R
[58] Field of Search ............ 73/17 A, 23.1, 28, 339 R, 73/17 R

[56] References Cited

U.S. PATENT DOCUMENTS

| 3,283,561 | 11/1966 | Fricke | 73/17 A |
|---|---|---|---|
| 3,641,339 | 2/1972 | McCormick | 73/23.1 X |
| 3,916,671 | 11/1975 | Carson et al. | 73/23.1 |
| 3,979,353 | 9/1976 | Smith et al. | 73/23 |

Primary Examiner—S. Clement Swisher
Attorney, Agent, or Firm—G. H. Telfer

[57] ABSTRACT

An on-line apparatus and method of using particulography as a technique for detecting and locating overheated material such as insulation within a gas-cooled dynamoelectric machine is disclosed. This technique detects the presence of and identifies the origin of thermoparticulates in a gas stream which are produced by thermal degradation of materials. The gas cooling system is continuously monitored by a gas stream monitor and upon the detection of thermoparticulates in the gas stream, the gas stream is diverted through a particulate collection chamber for entrapment of a sample of the thermoparticulates. The sample is then isolated from the gas cooling system and a flow of clean gas is forced through the sample while the collection chamber is heated at a predetermined rate. Heating the collection chamber will cause reparticulation of the thermoparticulates which are carried to a gas stream monitor located downstream by the flowing gas. The gas stream monitor will monitor the gas and will produce a signal that is proportional to the intensity of the thermoparticulates entrapped in the flowing gas stream. The signal from the gas stream monitor is applied to one axis of a recording device and a signal that is proportional to the temperature of the collection chamber is applied to the other axis producing a particulograph. A particulograph is unique to each kind of material that is present within the machine due to the unique thermoparticulation temperature of each material. Thus, by knowing where different types of materials are located within the machine, the location that is overheated can be identified.

9 Claims, 9 Drawing Figures

PARTICULOGRAPHY AS AN ON-LINE TECHNIQUE FOR DETECTION AND LOCATION OF FAULTS WITHIN A GAS-COOLED DYNAMOELECTRIC MACHINE CAUSED BY OVERHEATING

BACKGROUND OF THE INVENTION

1. Field of the Invention

This invention relates to apparatus and methods for the detecting of and identifying of overheated materials such as electrical insulation used in a gas-cooled dynamoelectric machine.

2. Description of the Prior Art

In recent years, a device commonly known as a generator condition monitor or gas stream monitor (Ref: U.S. Pat. No. 3,427,880 issued Feb. 18, 1969 and U.S. Pat. No. 3,573,460 issued Apr. 6, 1971) has been used to detect overheating within a dynamoelectric machine and overheated electrical insulation through the presence of thermoparticulates in the dynamoelectric machine's cooling gas. Thermoparticulates are formed in dynamoelectric machines as a product of thermal degradation of insulation. In the monitor, the molecules of a steadily flowing sample of the cooling gas are ionized to a state of equilibrium with a source of alpha-particles in an ionization chamber. The ions are then completely electrodeposited when the gas is passed between two charged electrodes in a collection chamber. The electrodeposition current is then amplified and applied to a recorder where it is continuously monitored. If there have been thermoparticulates entrained within a given sample, some of the ions will attach themselves to the thermoparticulates causing the number of free ions to decrease. The charged thermoparticulates have a much lower mobility as compared to the cooling gas ions, very few will be electrodeposited resulting in a decrease in the total electrodeposition current. This decrease is used as an indication of the presence of thermoparticulates caused by overheating.

When the generator condition monitor or gas stream monitor detects particulate matter in the gas stream caused by overheating of insulation, a signal is observed on the monitor's chart. A sample of the cooling gas is usually passed through a three-part collection arrangement to trap out particulate matter. (Ref. U.S. Pat. No. 3,972,225 issued Aug. 3, 1976). After the collection of the sample, the collection assembly may be sent to an analysis laboratory for identification. The location of the fault within the generator is then identified by employing mass spectroscopy. The generator particulate mass spectrogram is compared to standard spectrograms which are fingerprints of the different types of insulation used in the generator. Thus, the insulation that has undergone thermoparticulation can be identified.

There are four major disadvantages in the use of laborator mass spectroscopy for fault location within a generator; these are:

1. The generator condition monitor is far more sensitive than a mass spectrometer; it has been estimated that a factor of $10^5$ exists in favor of the gas steam condition monitor sensitivity.

2. A severe loss in particulate signal strength has been observed due to evaporation losses during transportation of the collection assembly from the location of the dynamoelectric machine to the laboratory that will perform the analysis.

3. The turn-around time for such an analysis can take up to several days; this means that the start-up of the machine is delayed by at least this amount of time.

4. This method of service and analysis is expensive.

SUMMARY OF THE INVENTION

An on-line apparatus and method of using particulography as a technique in detecting and locating overheating within a gas-cooled dynamoelectric machine is disclosed. This technique detects the presence of and identifies the origin of thermoparticulates in a gas stream which are produced by thermal degradation of materials. The gas cooling system is continuously monitored by a gas stream monitor and upon the detection of thermoparticulates in the gas stream a sample of the gas will automatically be collected. The sample is then isolated from the gas cooling system and clean gas is forced through the sample while the sample container is heated at a predetermined rate. A generator condition monitor or a gas stream monitor will monitor the gas that flows through the sample chamber and will produce a signal that is proportional to the intensity of the thermoparticulates that are reparticulated. The signal from the gas stream monitor is applied to one axis of a recording device and a signal that is proportional to the temperature of the sampling device is applied to the other axis producing a particulograph. A particulograph is unique to each kind of material that is present within the dynamoelectric machine. Thus, by knowing where different types of materials are located within the machine, one is able to locate the area of overheating.

Particulography may also be used as a means to identify pollutants by monitoring an exhaust sytem.

In addition particulography may be substituted as an effective laboratory means of identifying thermoparticulates instead of mass spectroscopy.

It is an object of this invention to provide an on-line technique for detection and location of faults within gas-cooled electrical apparatus, such as hydrogen-cooled dynamoelectric machines, caused by overheating that is far more sensitive, accurate and less expensive than the prior art.

It is a further object of this invention to provide an on-line technique for detecting and identifying unwanted thermoparticulates present in gas exhaust systems.

It is still a further object of this invention to provide a more sensitive laboratory technique than mass spectroscopy for identifying thermoparticulates.

DESCRIPTION OF THE PREFERRED EMBODIMENTS

The four disadvantages that were previously listed can be overcome by on-line particulography. In this technique, the particulates originally collected from the cooled gas stream, at alarm condition as detected by the gas stream monitor, are reheated and the new emitted particulates are again monitored by the same or a second gas stream monitor. A resultant particulogram can be generated by comparing the temperature that is required to re-emit or re-particulate the particles with the ion deposition current of the gas stream monitor. A particulogram is characteristic of both the particulates and the original materials from which the particulates were generated. Therefore, it provides a fingerprint for identifying the type of insulation or other material subject to excessive heating. Given this information and knowing which section of the dynamoelectric machine these materials were used, it is possible to isolate the location with the dynamoelectric machine that the problem or fault occured.

Figure 1:
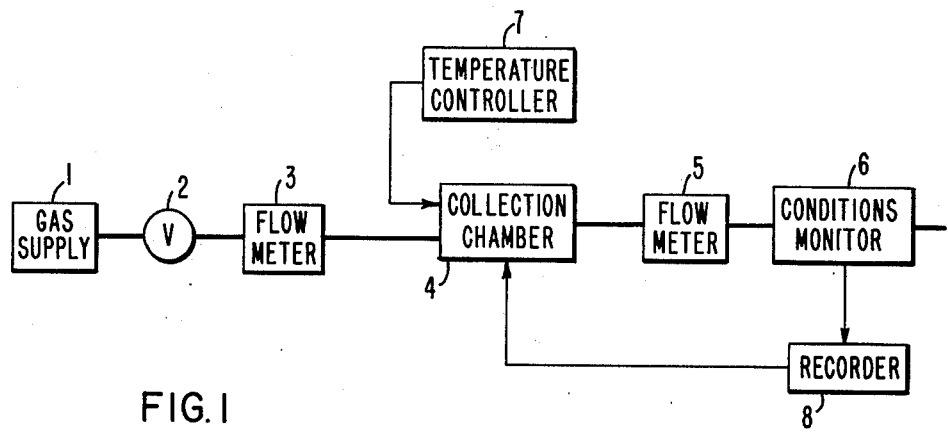
FIG. 1 is a schematic of an embodiment of laboratory apparatus used for particulography in accordance with the present invention.

FIG. 1 is a schematic of laborator apparatus that can be used for verification of the technique of particulography. Item 1 is a gas supply. In the case of the experiments to be described hydrogen was used. Item 2 is a regulator used to regulate the gas pressure. Item 3 is a flow meter. Item 4 is a heating chamber. Item 5 is a second flow meter. Item 6 is a gas stream monitor, in the case of the experiment, a condensation nuclei monitor. Item 7 is a temperature controller and 8 is the recorder.

Three different materials were thermoparticulated and collected separately on three glass fiber disks. These were silicone rubber, vinyl tolulene modified alkyd and epoxy resin. The glass fiber disks containing the particulates were transferred to the apparatus of FIG. 1. Each disk was placed in the stainless steel boat, which rested directly on a strip heater contained in the heating chamber 4. Accurate temperature measurements were made through a Chromel-Alumel thermocouple (not shown) attached to the boat and recorded by temperature recorder 8. A phase controlled temperature regulator 7 was connected through a sealed end plate to the boat and controlled the temperature of the heater. The temperature rise was maintained at 1° C. per minute. A flow rate of 8 liters per minute of hydrogen was maintained through the 2 inch o.d. stainless steel heating chamber 4 by flow meter 3 and regulator 2. The outlet flow meter 5 acted as a pressure relief while reading 4 liters per minute flow rate. The output of the thermocouple and condition monitor 6 was monitored on the two-pen potentiostatic recorder 8.

It was observed during the laboratory experiment that the reparticulation temperature for the three insulation materials was lower than the original particulation temperature. This is shown in Table 1.

TABLE 1

| Comparison of reparticulation temperatures with original particulation temperatures for three materials used in dynamoelectric machines. | | |
|---|---|---|
| Material | Particulation Temp. ° C | Reparticulation Temp. ° C |
| Silicone Rubber | 195 | 120 |
| Alkyd Resin | 251 | 205 |

TABLE 1-continued

| Comparison of reparticulation temperatures with original particulation temperatures for three materials used in dynamoelectric machines. | | |
|---|---|---|
| Material | Particulation Temp. ° C | Reparticulation Temp. ° C |
| Epoxy Resin | 207 | 121 |

In each instance, it can be seen that the temperature for reparticulation is considerably lower than the original particulation temperature.

Figure 2A:
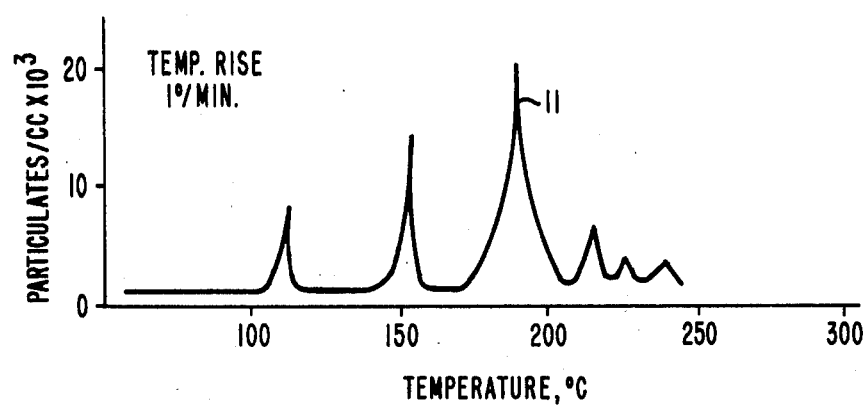
FIGS. 2a, 2b and 2c are charts of particulograms for three common types of insulating materials made employing apparatus such as that at FIG. 1.
Figure 2B:
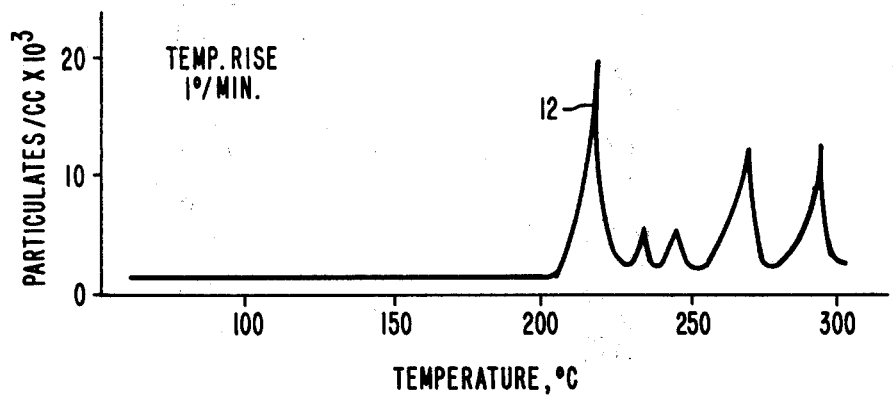
Figure 2C:
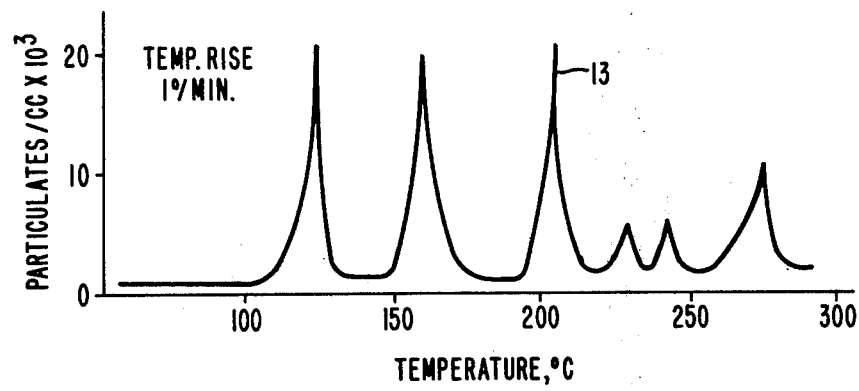

A distinctive particulogram for each material is obtained when particulates/cc are plotted against temperature or time when given the rate the temperature is increasing. FIG. 2 shows the patterns obtained for all three materials. The temperature incidence of the peaks and peak shapes are different in each case. Silicone rubber is curve 11; the alkyd is curve 12 and the epoxy is curve 13; and in each case the particulograms are entirely different.

Figure 3:
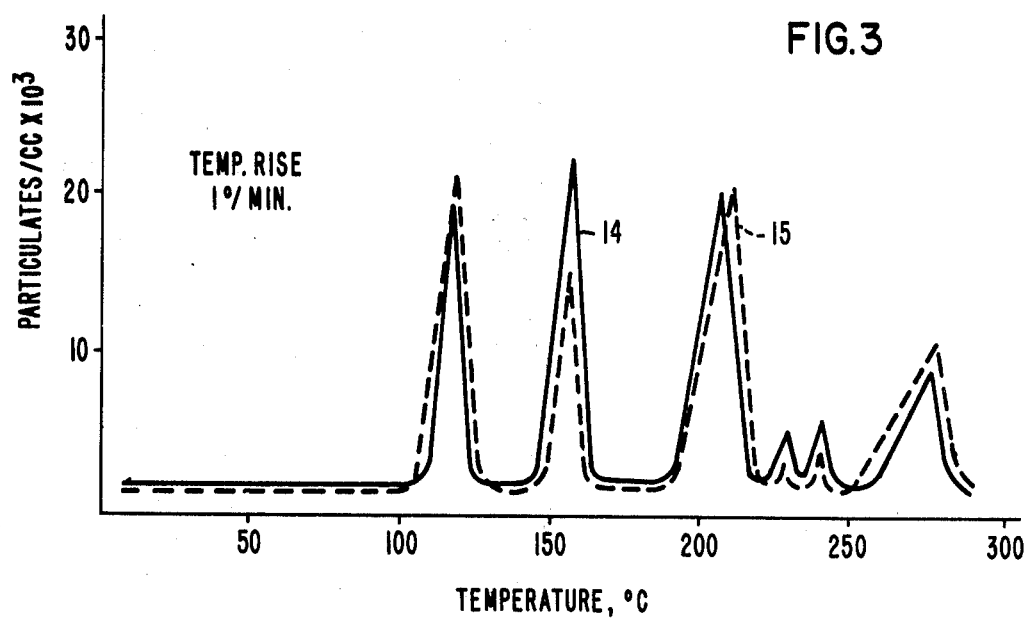
FIG. 3 is a chart of particulograms obtained on two separate experiments using epoxy resin.

To show the fingerprinting ability of this technique, a second sample of the epoxy resin was particulated and then reparticulated. A comparison of the particulograms obtained is shown in FIG. 3. It can be seen that the distinctive epoxy particulogram with three large peaks at approximately 125°, 160°, and 200° C. is repeated in each case. Curve 14 was the first run and curve 15 was the second run. These curves are almost superimposable. Hence, it is possible for these particulograms to be used to identify the insulation material which was overheated.

Figure 4:
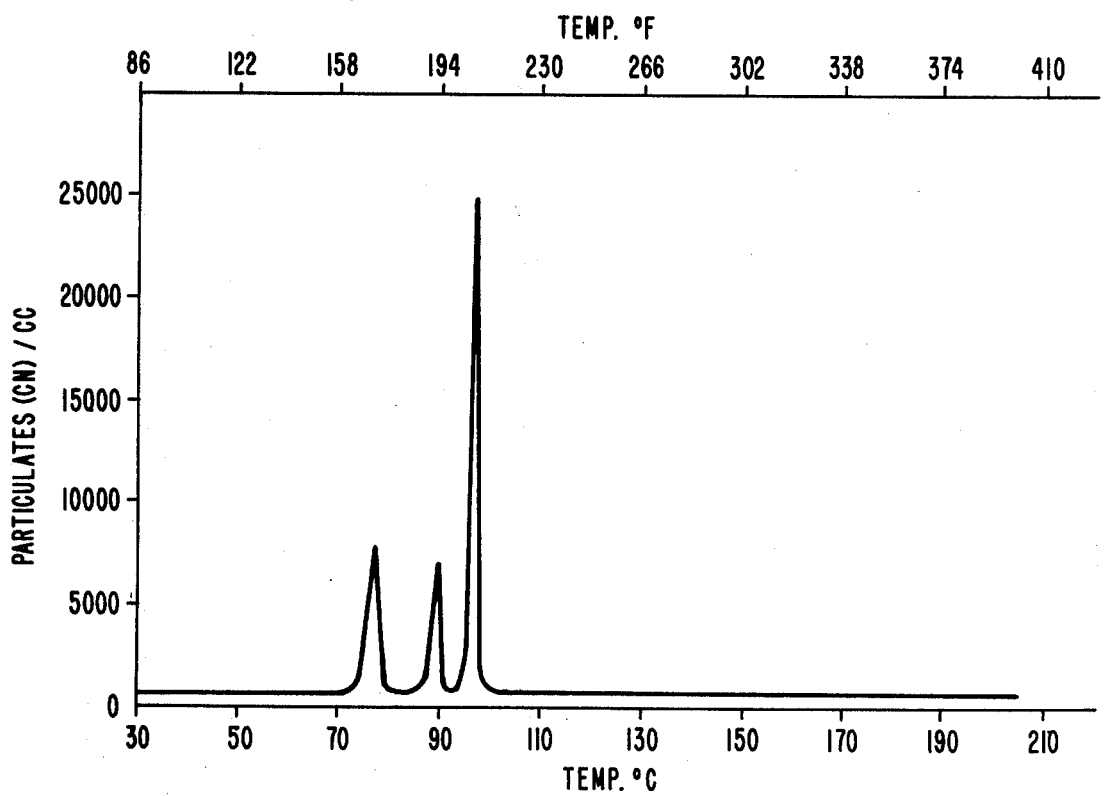
FIG. 4 is a chart showing reparticulation of exhaust particulates collected on a glass fiber disk.

A further indication of the potential of this technique is shown in FIG. 4, which depicts a particulogram of turbine exhaust particulates, reparticulated from a glass fiber filter. Three distinct peaks can be seen at 75°, 85° and 95° C. These peaks originate from $H_2SO_4$ and other organic material collected on the filter from the turbine exhaust gases. Analysis of filter-collected stack or atmospheric particulates by extraction and chemical means is currently a severe problem in pollution monitoring. It is anticipated that the specificity, sensitivity, and on-line capabilities of particulography will make it a valuable research and analytical tool for the study of atmospheric particulates and specifically, those that are emitted by exhaust systems into the environment.

Figure 5:
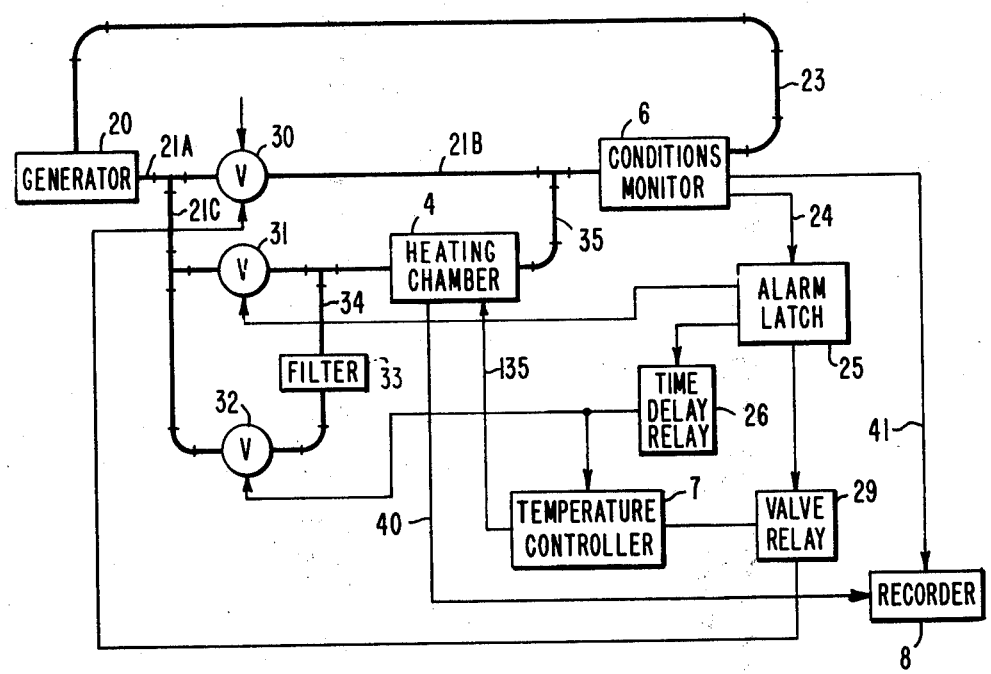
FIG. 5 is a schematic representation of instrumentation in accordance with one embodiment of the invention, for carrying out reparticulation analysis on site in condition monitoring of a gas-cooled generator.

In accordance with a preferred embodiment the instrumentation set-up for carrying out the reparticulation work on a dynamoelectric machine site is shown in FIG. 5. Under normal running conditions the cooling gas flows from the generator 20 through conduit 21, into gas stream monitor 6, back through conduit 23, into the dynamoelectric machine. When the gas stream monitor detects the presence of thermoparticulates, it will generate an alarm which will be sensed by alarm latch 25. The gas stream monitor can either be a condensation nuclei monitor or, as described earlier, an ionization type monitor. Alarm latch 25 is connected to the gas stream monitor by line 24. Alarm latch 25 generates a signal wich is connected to the time delay relay 26 which is a delay before operation relay. Relay 26 will time the sampling sequence for collecting a sample of the thermoparticulates. The alarm latch also will cause solenoid valve means 30 to close through valve relay 29, blocking the flow of the gas from the dynamoelectric machine to the monitor and solenoid 31 to open diverting the flow of cooling gas from the gas stream condition monitor into the collecting and heating chamber 4.

Within the chamber 4 there is a glass fiber disk (not shown) that is used for entrapment of the particulates. The disk is designed to collect particles within the range of $1 \times 10^{-10}$ to $1 \times 10^{-6}$ meters. The time delay relay 26 is designed to allow time for the glass filter disk to entrap an adequate number of thermoparticulates. The time delay can readily be determined by one skilled in the art given the system parameters. Upon the completion of the entrapment of the thermoparticulates, the time delay relay will close and its output will be connected to the temperature controller 7 and solenoid 32. Upon the occurrence of the timing out of relay 26, solenoid valve means 31 will close and solenoid valve means 32 will open.

Figure 6:
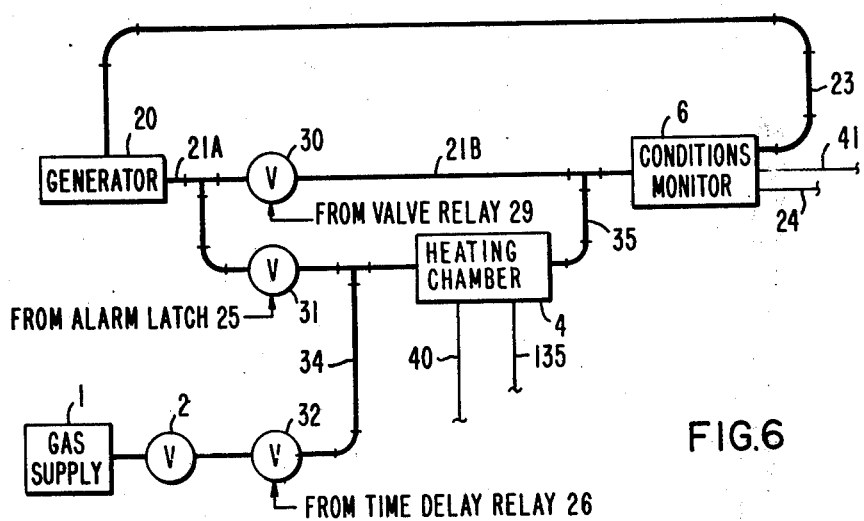
FIG. 6 is a schematic representation of another embodiment of the invention.

It is of prime importance during the process of reparticulation to flow clean gas through the heated collection chamber and glass filter disk for acceptance of the reparticulation particles. This can be accomplished by one of two ways. Solenoid valve means 32 could be connected to a clean gas source as shown in FIG. 6 and in which case it would conduct clean gas through the collection chamber for entrapment of the thermoparticulates and then into the monitor or, as in the case of FIG. 5, solenoid valve 32 accepts the dynamoelectric machine's cooling gas and passes it on to filtering means 33. The filtering is designed to remove essentially all of the particles less than several microns in size.

Conduit 34 connects the filtering means to the input of the collector heater, the gas goes through the collector heater and conduit 35, into the gas stream monitor 4, then into conduit 23 where it is returned to the dynamoelectric machine.

The heating element that is mounted within the collector assembly is connected to the temperature controller 7 by line 135. As was previously stated, when time delay relay means 26 times out, it will initiate the heating sequence, current conductor 135 will conduct current to the heating element and the temperature controller will be set to increase the heat at a rate ranging from 1° C. per minute all the way up to 50° C. per minute. It will be understood that all numerical values that are provided in the disclosed embodiments are merely for purposes of illustration, and that variations may be made therein without departing from the spirit and the scope of this invention as defined in the appended claims.

The temperature of the chamber is recorded on one axis of recorder 8 by means of a thermocouple (not shown) and line 40. The output of the gas stream monitor is connected to the other axis by line 41. As the temperature increases, a trace will be recorded on the recorder and compared with the output of the gas stream monitor 6. The gas stream monitor 6 can either be the condensation nuclei monitor or the ionization type monitor. There have been very good results with each type.

Figure 7:
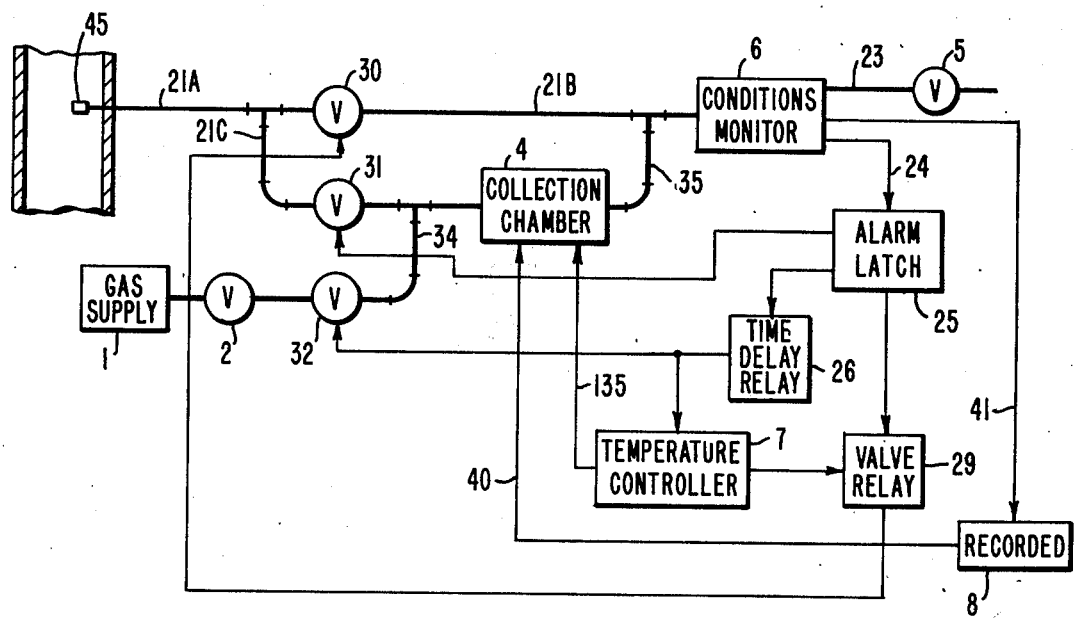
FIG. 7 is a schematic representation of the instrumentation for carrying out reparticulation analysis on an exhaust system.

FIG. 7 is an embodiment wherein the particulography is used as a technique for identifying exhaust pollutants. Gases that are picked up by exhaust scoop 45 are conducted through solenoid valve means 30, conduit 21B are into condition monitor 6. The condition monitor has exhaust conduit 23 with flow control device 5 mounted on its end. The gases after passing through flow control device 5 may be returned to the exhaust system or vented into the surrounding environment. Upon the gas stream condition monitor's detecting the presence of thermoparticulates, it will generate an alarm which will be conducted by line 24 to alarm latch 25. Alarm latch 25 will cause solenoid valve means 30, through valve relay 29, to close and solenoid valve means 31 to open. Conduit 21A and 21C will conduct the exhaust gases into the collection chamber where a glass fiber disk is located for collection of particulates, through conduit 21B into the condition monitor and out through the exhaust conduit 23. Alarm latch 25 will initiate delay before operate relay 26. Delay before operate relay 26 is set to insure a collection of an adequate sample within the collection chamber. Upon the timing out of the delay relay 26, the temperature control cycle will be initiated. Line 40 is connected to a thermocouple or other temperature sensing device mounted within the collection chamber and to the input amplifier of one side of one axis of recorder 8. The electrical output of the gas stream monitor 41 is connected to the opposite axis of recording device 8. The temperature within the collection chamber is increased at a predetermined rate approximately 1° C. per minute or in some cases all the way up to 50° C. per minute. It depends upon the quality of the instruments that are being used as to what exactly this rate will be. When the temperature within the collection chamber has reached a predetermined value, it will be sensed by the controller 7 and will cause solenoid 32 to close and through valve relay 29 solenoid 30 to open and returned to the initial state prior to the receipt of the alarm. The resultant particulogram can be used in identifying unwanted pollutants or to assure that there is proper combustion.

From the above discussion, we can deduct the following:

1. Particulography can be used to identify overheated materials in a gas-cooled dynamoelectric machine.

2. On-site analysis is available; rapid decisions can be made with regard to reduce load, shut-down, etc.

3. No loss in particulate signal will be encountered due to vaporization of the collected particulates in transportation as in the case when glass fiber disks are sent to the laboratories for analysis.

It is understood that the embodiments disclosed are merely for the purposes of illustration, and that variation may be made therein without departing from the spirit and scope of this invention as defined in the appended claims.

We claim:

1. An on-line method of using thermoparticulography as a technique of identifying thermoparticulates in a gas stream, comprising:
   detecting the presence of said thermoparticulates in said gas stream;
   collecting a sample of said thermoparticulates from said gas stream;
   isolating said sample from said gas stream,
   reparticulating said sample by heating said sample at a predetermined rate;
   measuring the temperature of said sample while measuring the particulate intensity as indicated by the output signal of said gas stream monitor; and
   preparing a thermoparticulograph by plotting said particulate intensity as a function of temperature of said collected sample during reparticulation.

2. The method according to claim 1 wherein said method is used as an on-line technique for detecting and localizing a fault by identifying thermoparticulates caused by overheating within a gas cooled generator and identifying that section of said generator where there is located a material that produced said thermoparticulates.

3. An on-line apparatus for generation of thermoparticulographs which are used to identify thermoparticulates within a gas stream comprising:
- gas stream monitoring means for detecting thermoparticulates by monitoring a gas stream exposed to thermoparticulate producing materials and for generating a first signal when said thermoparticulates are detected,
- sampling means for sampling said exposed gas stream and collecting a sample of said thermoparticulates when said first signal is generated,
- means for determining when said sampling means has completed collecting said sample and for generating a second signal in response to sampling completion,
- isolation means for isolating said sample from said exposed gas stream when said second signal is generated,
- controlled heating means which heats said sample at a predetermined rate and thereby causes reparticulation of said thermoparticulates,
- a reparticulated gas stream monitoring means which is connected to said sampling means and generates a third signal which is proportional to the number of thermoparticulates detected,
- temperature monitor means that measures the temperature of said sample, and
- recording means for recording said third signal as a function of said temperature of said sample.

4. An on-line apparatus according to claim 3 further comprising an alarm generating means that sounds an alarm in response to said first signal.

5. An on-line apparatus according to claim 3 wherein said sampling means comprises:
- a solenoid valve which controls the flow of said gas stream to said sampling means, and
- a stainless steel chamber which contains a glass fiber disk for trapping of said thermoparticulates.

6. An on-line apparatus according to claim 3 wherein said controlled heating means will increase the temperature of said collected sample at a rate less than 1° C./minute.

7. An on-line apparatus according to claim 3 wherein said controlled heating means will increase the temperature of said collected sample at a rate in the range of 1° to 50° C./minute.

8. A dynamoelectric machine system, having a cooling gas stream and an on-line apparatus for generation of thermoparticulographs which are useful to identify thermoparticulates within a gas stream and, hence, the location of the origin of overheating, comprising:
- gas stream monitor means for detecting thermoparticulates which are produced from the thermal degradation of materials by monitoring a gas stream exposed to said thermoparticulates and for generating a first signal when said thermoparticulates are detected,
- sampling means for sampling said gas stream upon the occurrence of said first signal and includes; a chamber, a filter mounted within said chamber for trapping thermoparticulates, a first solenoid valve, and a second solenoid valve whereby upon the occurrence of said first signal said first solenoid valve closes and said second solenoid valve opens placing said chamber upstream from and in fluid communication with said gas stream monitor;
- time delay means for determining when said sampling means has completed taking a sample and then generate a second signal that closes said second solenoid valve;
- an isolation means for isolating said sample from said gas stream which comprises: a third solenoid valve and a filter means placed upon stream from said sampling means to provide clean gas for passage through said sampling means upon said third solenoid valve opening in response to said second signal;
- a controlled heating means which heats said sample and causes reparticulation of thermoparticles entrapped within said sample and force said thermoparticulates into said filter gas stream for detection by said gas stream monitor;
- said controlled heating means being monitored by a temperature sensing means whose output is proportional to the temperature of said heated chamber and is applied to a first axis of a recording means; and
- said gas stream monitor produces an output signal that is proportional to the intensity of said thermoparticulates in said filter gas stream and said signal is applied to a second axis of said recording means thereby producing a resultant unique thermoparticulogram for each type of said thermoparticulates.

9. In combination, a pollution identification system having an on-line apparatus for generation of thermoparticulographs which are used to identify thermopollutants within an exhaust system and comprises:
- a gas diverting means for diverting a portion of said exhaust system to a first conduit,
- a first solenoid valve means in line with said first conduit and in fluid communication with said gas diverting means,
- a gas stream monitor in line with said solenoid valve means, that provides an output signal that is proportional to pollutants within said exhaust system,
- a first signal generating means that provides a first signal when said output signal exceeds a predetermined level,
- a sampling means including a sampling chamber containing a glass fiber disk which will entrap pollutants, a second solenoid valve that is connected to said sampling chamber, said sampling means collecing a sample of said pollutants which said glass fiber disk when in response to said first signal said first solenoid closes and said second solenoid opens,
- said sampling chamber is connected to said gas stream monitor means by a conduit that Tees into said second conduit,
- a close after delay relay initiated by said first signal and set to close at a predetermined time which corresponds to the time required to collect an adequate sample within said sampling chamber,
- a second signal closes said second solenoid and opens a third solenoid disposed in a conduit between a pressurized clean gas source and said sampling chamber which allows clean gas to flow from said source through said sampling chamber into said first conduit and into said gas stream monitor,
- controlled heating means disposed around said sampling chamber for heating said chamber at a predetermined rate upon the generation of said second signal,
- a temperature sensor for measuring the temperature of said chamber and applying the output of said sensor to an axis on a recording device, and
- means for generating a thermograph by connecting the other axis of said recording device to said gas stream monitor output, said output being proportional to the intensity of each type of pollutants that are combustion by-products.

* * * * *